United States Patent
Chen et al.

(10) Patent No.: US 9,443,927 B2
(45) Date of Patent: Sep. 13, 2016

(54) SEMICONDUCTOR DEVICE

(71) Applicant: UNITED MICROELECTRONICS CORP., Hsin-Chu (TW)

(72) Inventors: Lu-An Chen, Hsinchu County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 15 days.

(21) Appl. No.: 14/446,344

(22) Filed: Jul. 30, 2014

(65) Prior Publication Data

US 2016/0035823 A1  Feb. 4, 2016

(51) Int. Cl.
| | |
|---|---|
| H01L 23/62 | (2006.01) |
| H01L 29/06 | (2006.01) |
| H01L 29/78 | (2006.01) |
| H01L 29/08 | (2006.01) |
| H01L 29/10 | (2006.01) |

(52) U.S. Cl.
CPC ........ *H01L 29/0619* (2013.01); *H01L 29/0692* (2013.01); *H01L 29/086* (2013.01); *H01L 29/0869* (2013.01); *H01L 29/7816* (2013.01); *H01L 29/0878* (2013.01); *H01L 29/1095* (2013.01)

(58) Field of Classification Search
CPC ........... H01L 29/0619; H01L 29/7816; H01L 29/1095
See application file for complete search history.

(56) References Cited

U.S. PATENT DOCUMENTS

| | | | | |
|---|---|---|---|---|
| 4,914,051 | A * | 4/1990 | Huie | H01L 21/28 148/DIG. 126 |
| 5,925,910 | A * | 7/1999 | Menegoli | H01L 27/0727 257/321 |
| 5,973,361 | A * | 10/1999 | Hshieh | H01L 21/26586 257/330 |
| 8,093,121 | B1 | 1/2012 | Ransom et al. | |
| 2006/0186467 | A1* | 8/2006 | Pendharkar | H01L 27/088 257/337 |
| 2009/0008710 | A1* | 1/2009 | Wei | H01L 29/0696 257/337 |
| 2010/0176449 | A1* | 7/2010 | Matsudai | H01L 21/2652 257/335 |
| 2011/0079849 | A1* | 4/2011 | Yan | H01L 29/0696 257/343 |
| 2013/0207186 | A1* | 8/2013 | Cai | H01L 29/0847 257/339 |
| 2013/0277741 | A1* | 10/2013 | Guowei | H01L 29/402 257/343 |
| 2014/0035034 | A1* | 2/2014 | Lin | H01L 29/1045 257/339 |

* cited by examiner

*Primary Examiner* — A. Sefer
(74) *Attorney, Agent, or Firm* — Winston Hsu; Scott Margo

(57) ABSTRACT

A semiconductor device includes a substrate, a gate positioned on the substrate, a drain region and a source region formed in the substrate at two respectively sides of the gate, a first well region formed in the substrate, and a plurality of first doped islands formed in the source region. The drain region and the source region include a first conductivity, and the first well region and the first doped islands include a second conductivity. The source region is formed in the first well region, and the first doped islands are spaced apart from the first well region.

14 Claims, 4 Drawing Sheets

SEMICONDUCTOR DEVICE

BACKGROUND OF THE INVENTION

1. Field of the Invention

The invention relates to a semiconductor device, and more particularly, to a semiconductor device for electrostatic discharge (hereinafter abbreviated as ESD) protection.

2. Description of the Prior Art

Chips and/or Integrated circuits (ICs) are the most essential hardware foundation of the modern information society. As products based on ICs become more delicate, they also become more vulnerable to impacts from external environment. For example, it is found that ESD is a constant threat to modern electronics.

Generally considered ESD has two modes: human body mode (HBM) and machine mode (MM). In the human body mode, static electricity is discharged from human body to a semiconductor device when a user touches a body part of the semiconductor device. Static electricity discharged from a human body to a device typically has a high voltage of about 2000V and is discharged through great impedance. Another source of ESD is from metallic objects, known as the machine mode, is characterized by a greater capacitance and lower internal resistance than the HBM ESD source. The result of ESD on unprotected ICs is often destruction, characterized by melting or explosion of a part of the ICs. Therefore, the ESD protection devices are taken as important components of the protection circuitry provided in today's electronic devices.

Various approaches have been made to provide ESD protection device associated with IC interface pads to prevent a core circuit of the ICs from the ESD damages. Typically, during a normal IC operation, the ESD protection device is turned off. However when an ESD event occurs, the ESD surges will cause the ESD protection device to breakdown and create a substrate current path, through which the ESD current is diverted to ground and thus the core circuit is protected. Therefore, it is conceivable that if the ESD protection device can be quickly triggered, it will be better to bypass the ESD current from the core circuit.

There is therefore a continuing need in the semiconductor processing art to develop an ESD protection device having lower trigger voltage which can be quickly turned on in order to render immediate protection to the core circuit. Furthermore, it is found that the trigger voltage of the ESD protection device is related to the substrate resistance (hereinafter abbreviated as $R_{sub}$) : Small $R_{sub}$ leads to a higher trigger voltage which is undesirable to the ESD protection device. In view of the above, there exists a need for the ESD protection device having increased $R_{sub}$ that results in reduced trigger voltage.

SUMMARY OF THE INVENTION

According to the claimed invention, a semiconductor device is provided. The semiconductor device includes a substrate, a gate positioned on the substrate, a drain region and a source region formed in the substrate at two respectively sides of the gate, a first well region formed in the substrate, and a plurality of first doped islands formed in the source region. The drain region and the source region include a first conductivity, and the first well region and the first doped islands include a second conductivity. The source region is formed in the first well region, and the first doped islands are spaced apart from the first well region.

According to the semiconductor devices provided by the present invention, the first doped islands having the second conductivity complementary to the source region are spaced from the first well region, which also includes the second conductivity type. It is found that $R_{sub}$ is conspicuously increased thereby, and thus the trigger voltage of the semiconductor device is desirably reduced. Consequently, the semiconductor device can be quickly turned on for rendering immediate ESD protection to the core circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
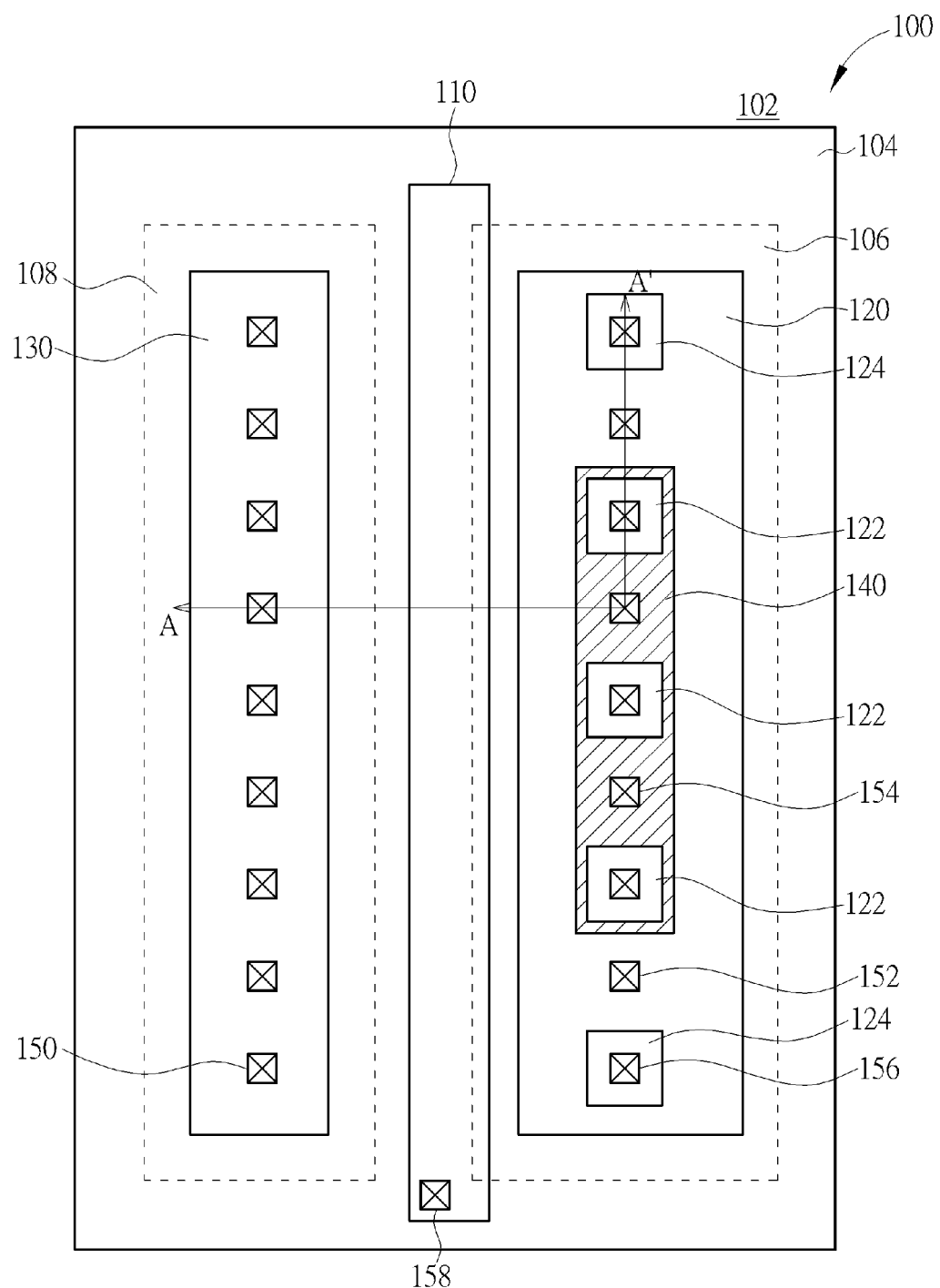
FIG. 1 is a schematic drawing illustrating a semiconductor device provided by a first preferred embodiment of the present invention.
Figure 2:
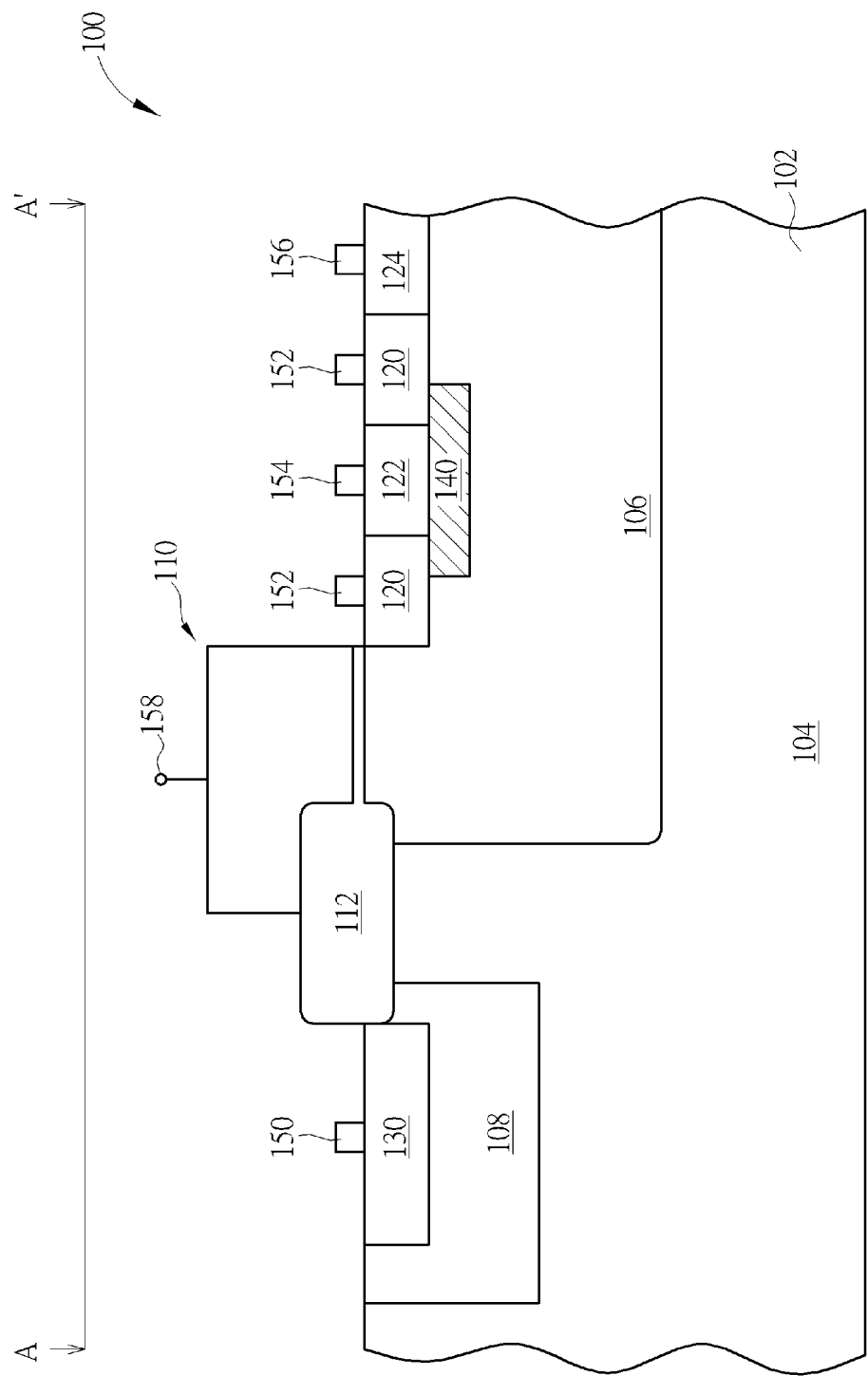
FIG. 2 is a cross-sectional view taken along Line A-A' of FIG. 1.

Please refer to FIGS. 1-2, wherein FIG. 1 is a schematic drawing illustrating a semiconductor device provided by a first preferred embodiment of the present invention, and FIG. 2 is a cross-sectional view take along Line A-A' of FIG. 1. As shown in FIGS. 1 and 2, a semiconductor device 100 provided by the preferred embodiment includes a substrate 102 having a deep well region 104 formed therein. In the preferred embodiment, the deep well region 104 includes a first conductive type and the substrate 102 includes a second conductive type. The first conductivity type and the second conductivity type are complementary to each other. According to the preferred embodiment, the first conductive type is n type and the second conductive type is p type. Therefore the device 100 provided by the preferred embodiment is an n-typed semiconductor device 100 positioned on an n-typed deep well region 104 in a p-typed semiconductor substrate 102. However, those skilled in the art would easily realize that the first conductivity type can be p type and the second conductivity type can be n type in other preferred embodiment.

Please still refer to FIGS. 1-2. The semiconductor device 100 provided by the preferred embodiment includes a gate 110 and an isolation structure 112 such as a field oxide (FOX) layer and a gate dielectric layer formed on the substrate 102, particularly in the deep well region 104, and the gate 110 covers a portion of the isolation structure 112. It is noteworthy that for clarifying the spatial relationship between the gate 110 and other elements, the isolation structure 112 is omitted from FIG. 1.

Please refer to FIGS. 1-2 again. The semiconductor device 100 further includes a first well region 106 and a second well region 108 formed in the deep well region 104, and spaced apart from each other by the gate 110 and the isolation structure 112 as shown in FIG. 2. The first well region 106 includes the second conductivity type and the second well region 108 includes the first conductivity type. In the preferred embodiment, the first well region 106 is a p-typed body region 106 and the second well region 108 is an n-typed drift region 108. The semiconductor device 100 further includes a source region 120 and a drain region 130 formed in the deep well region 104 in the substrate 102. More particularly, the source region 120 is formed in the first well region 106 while the drain region 130 is formed in the second well region 108. The source region 120 and the drain region 130 both include the first conductivity type and thus are an n-typed source region 120 and an n-typed drain region 130.

The semiconductor device 100 provided by the preferred embodiment includes a plurality of first doped islands 122 and at least a second doped island 124 formed in the source region 120 in the first well region 106. In the preferred embodiment, the first doped islands 122 and the second doped islands 124 are arranged in a line with the second doped islands 124 formed at two ends of the line. However those skilled in the art would easily realize that there can be only one second doped island 124 disposed one end of the line formed by the first doped islands 122. The first doped islands 122 and the second doped islands 124 all include the second conductivity type. In the preferred embodiment, the first doped islands 122 and the second doped islands 124 are all p-typed islands. Furthermore, a concentration of the first doped islands 122 is equal to a concentration of the second doped islands 124. And a depth of the first doped islands 122 is equal to a depth of the second doped islands 124. Additionally speaking, the depth of the first doped islands 122, the depth of the second doped island 124, and a depth of the source region 120 are all the same. The difference between the first doped islands 122 and the second doped islands 124 is: the first doped islands 122 are spaced apart from the first well region 106 while the second doped islands 124 contact the first well 106 region.

Please still refer to FIGS. 1 and 2. The semiconductor device 100 provided by the preferred embodiment includes a doped region 140 formed in the first well region 106 under the first doped islands 122 as shown in FIG. 2. That is, a depth of the doped region 140 is larger than a depth of the first doped islands 122 and the source region 120. The doped region 140 includes the first conductivity type. Furthermore, a concentration of the doped region 140 is smaller than a concentration of the source region 120, but the concentration of the doped region 140 is larger than a concentration of the deep well region 104. More important, the first doped islands 122 are spaced apart from the first well region 106 by the doped region 140 and the source region 120. As shown in FIGS. 1 and 2, sidewalls of the first doped islands 122 are spaced apart from the first well region 106 by the source region 120 and bottoms of the first doped islands 122 are spaced apart from the first well region 106 by the doped region 140. As shown in FIG. 2, the bottoms of the first doped islands 122 contact the doped region 140.

Additionally, a plurality of drain contacts 150 are formed in the drain region 130 and electrically connected to the drain region 130, a plurality of source contacts 152 are formed in the source region 120 and electrically connected to the source region 120, a plurality of first contacts 154 are formed in the first doped islands 122 and electrically connected to the first doped islands 122, a plurality of second contacts 156 are formed in the second doped islands 124 and electrically connected to the second doped islands 124, and at least a gate contact 158 is formed on the gate 110 and electrically connected to the gate 110. Those skilled in the art would easily realize that amounts of the drain contacts 150, the source contacts 152, the first contacts 154, the second contacts 156, and the gate contact 158 are adjustable depending on different product requirements, thus those details are omitted for simplicity.

According to the semiconductor device 100 provided by the first preferred embodiment, the doped region 140 is provided to space apart the first doped islands 122 from the first well region 106 and resulted in an increased $R_{sub}$. Consequently, the trigger voltage of the semiconductor device 100 is reduced without impacting other specification such as the breakdown voltage of the semiconductor device 100.

Figure 3:
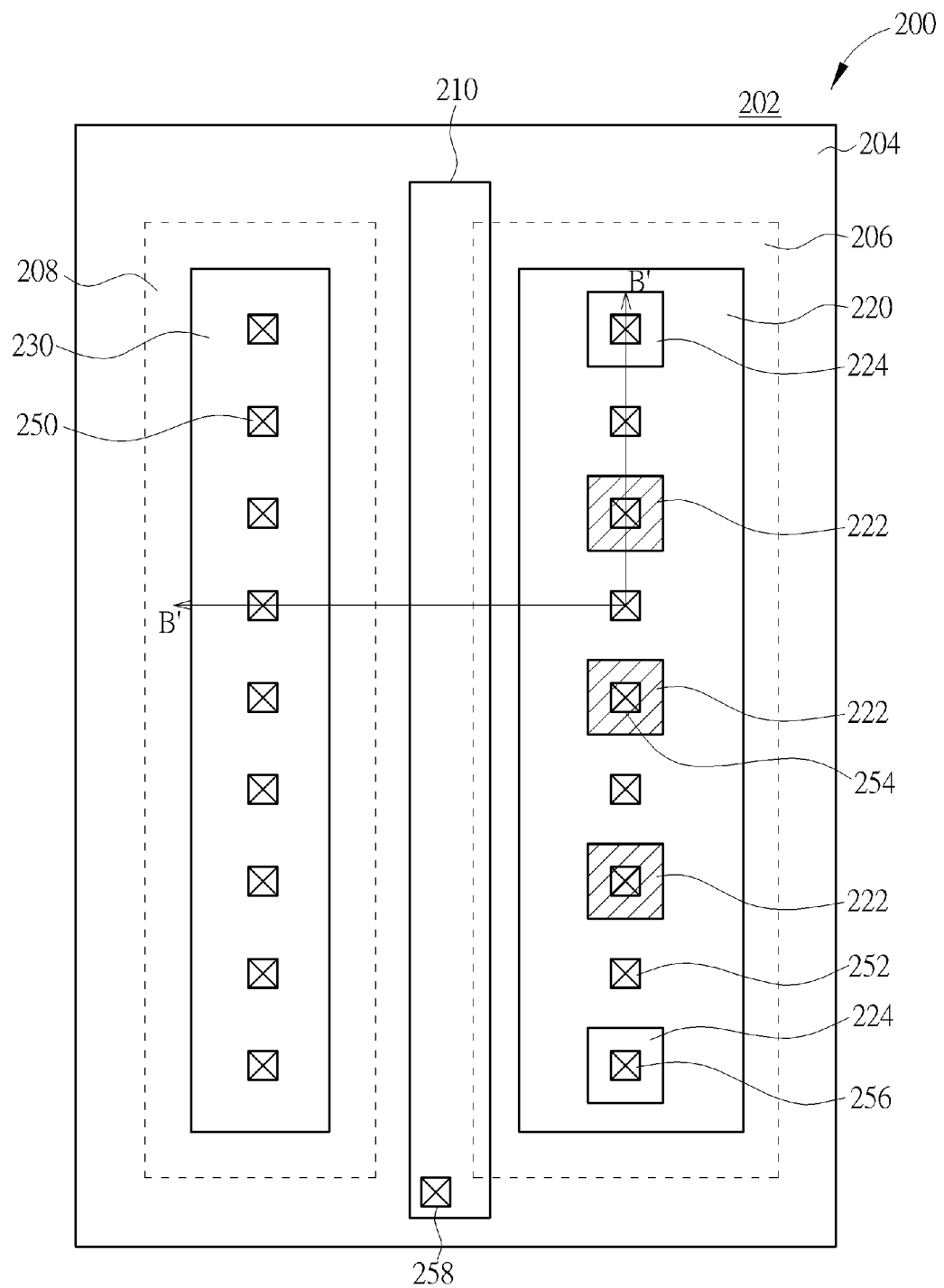
FIG. 3 is a schematic drawing illustrating a semiconductor device provided by a second preferred embodiment of the present invention.
Figure 4:
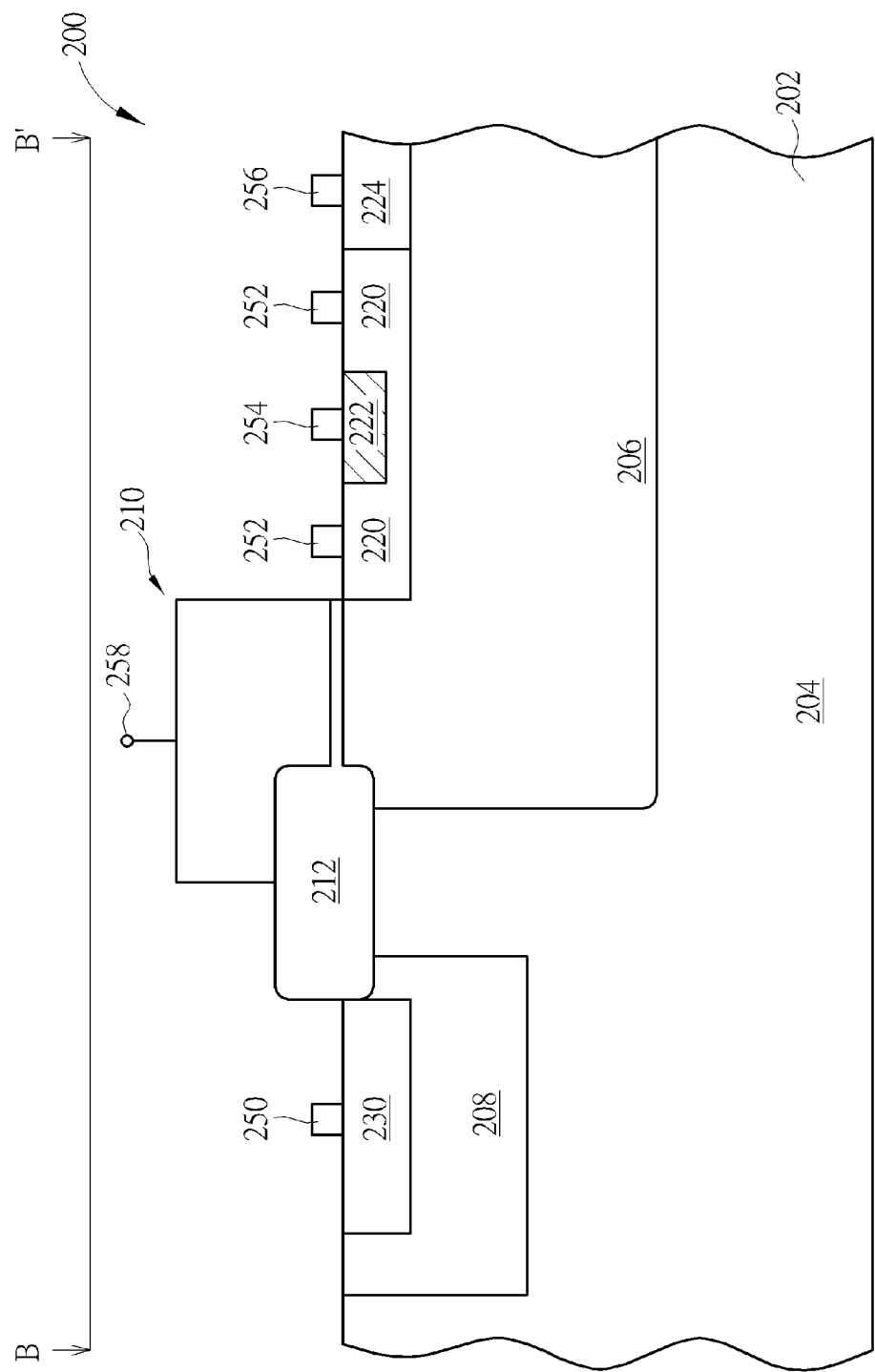
FIG. 4 is a cross-sectional view taken along Line B-B' of FIG. 3.

Please refer to FIGS. 3-4, wherein FIG. 3 is a schematic drawing illustrating a semiconductor device provided by a second preferred embodiment of the present invention, and FIG. 4 is a cross-sectional view take along Line B-B' of FIG. 3. As shown in FIGS. 3 and 4, a semiconductor device 200 provided by the preferred embodiment includes a substrate 202 having a deep well region 204 formed therein. In the preferred embodiment, the deep well region 204 includes a first conductive type and the substrate 202 includes a second conductive type. The first conductivity type and the second conductivity type are complementary to each other. In the preferred embodiment, the first conductive type is n type and the second conductive type is p type. Therefore the device 200 provided by the preferred embodiment is an n-typed semiconductor device 200 positioned on the n-typed deep well region 204 in a p-typed semiconductor substrate 202. As mentioned above, those skilled in the art would easily realize that the first conductivity type can be p type and the second conductivity type can be n type in other preferred embodiment.

Please refer to FIGS. 3-4 again. The semiconductor device 200 provided by the preferred embodiment includes a gate 210 and an isolation structure 212 such as a field oxide (FOX) layer and a gate dielectric layer formed on the substrate 202, particularly in the deep well region 204, and the gate 210 covers a portion of the isolation structure 212. It is noteworthy that for clarifying the spatial relationship between the gate 210 and other elements, the isolation structure 212 is omitted from FIG. 3.

Please still refer to FIGS. 3-4. The semiconductor device 200 further includes a first well region 206 and a second well region 208 formed in the deep well region 204, and spaced apart from each other by the gate 210 and the isolation structure 212 as shown in FIG. 4. The first well region 206 includes the second conductivity type and the second well region 208 includes the first conductivity type. In the preferred embodiment, the first well region 206 is a p-typed body region 206 and the second well region 208 is an n-typed drift region 208. The semiconductor device 200 further includes a source region 220 and a drain region 230 formed in the deep well region 204 in the substrate 202. More particularly, the source region 220 is formed in the first well region 206 while the drain region 230 is formed in the second well region 208. The source region 220 and the drain region 230 both include the first conductivity type and thus are an n-typed source region 220 and an n-typed drain region 230.

The semiconductor device 200 provided by the preferred embodiment includes a plurality of first doped islands 222 and at least a second doped island 224 formed in the source region 220 in the first well region 206. In the preferred embodiment, the first doped islands 222 and the second doped islands 224 are arranged in a line with the second doped islands 224 formed at two ends of the line. However those skilled in the art would easily realize that there can be only one second doped island 224 disposed one end of the line formed by the first doped islands 222. The first doped islands 222 and the second doped islands 224 all include the second conductivity type. In the preferred embodiment, the first doped islands 222 and the second doped islands 224 are all p-typed islands. Furthermore, a concentration of the first doped islands 222 is equal to a concentration of the second doped islands 224.

The difference between the first doped islands 222 and the second doped island 224 is: A depth of the first doped islands 222 is smaller than a depth of the second doped islands 224 and the source region 220. Since the depth of the first doped islands 222 is smaller than the depth of the source region 220, the first doped islands 222 are spaced apart from the first well region 206 by the source region 220 while the second doped island 224 contacts the first well region 206. As shown in FIG. 4, sidewalls and bottoms of the first doped islands 222 contact the source region 220, and thus the sidewalls and the bottoms of the first doped islands 222 are spaced apart from the first well region 206 by the source region 220. That is, the first doped islands 222 are surrounded by the source region 220.

Additionally, a plurality of drain contacts 250 are formed in the drain region 230 and electrically connected to the drain region 230, a plurality of source contacts 252 are formed in the source region 220 and electrically connected to the source region 220, a plurality of first contacts 254 are formed in the first doped islands 222 and electrically connected to the first doped islands 222, a plurality of second contacts 256 are formed in the second doped islands 224 and electrically connected to the second doped islands 224, and a gate contact 258 are formed on the gate 210 and electrically connected to the gate 210. Those skilled in the art would easily realize that amounts of the drain contacts 250, the source contacts 252, the first contacts 254, the second contacts 256, and the gate contact 258 are adjustable depending on different product requirement, thus those details are omitted for simplicity.

According to the ESD protection semiconductor device 200 provided by the first preferred embodiment, the first doped islands 222 are spaced apart from the first well region 206 by the source region 220 and resulted in an increased $R_{sub}$. Consequently, the trigger voltage of the semiconductor device 200 is reduced without impacting other specification such as the breakdown voltage of the semiconductor device 200.

Additionally, in a modification to the present invention, the p-typed islands can be spaced from the p-typed body region in a bipolar junction transistor (BJT) for increasing $R_{sub}$, and consequently reducing the trigger voltage.

According to the semiconductor devices provided by the present invention, the first doped islands having the second conductivity complementary to the source region are spaced from the first well region, which also includes the second conductivity type, by the doped region or by the source region. It is found that $R_{sub}$ is conspicuously increased thereby, and thus the trigger voltage of the semiconductor device is desirably reduced by 15% compared to the conventional semiconductor device. Consequently, the semiconductor device can be quickly turned on for rendering immediate ESD protection to the core circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   a gate positioned on the substrate;
   a drain region and a source region formed in the substrate at two respectively sides of the gate, the drain region and the source region comprising a first conductivity type;
   a first well region comprising a second conductivity type formed in the substrate, and the source region being formed in the first well region;
   a doped region comprising the first conductivity type formed in the first well region; and
   a plurality of first doped islands having the second conductivity type formed in the source region, the first doped islands being entirely spaced apart from the first well region by the doped region and the source region.

2. The semiconductor device according to claim 1, wherein the first conductivity type and the second conductivity type are complementary to each other.

3. The semiconductor device according to claim 1, wherein a concentration of the doped region is smaller than a concentration of the source region.

4. The semiconductor device according to claim 1, wherein a depth of the doped region is larger than a depth of the source region and a depth of the first doped islands.

5. The semiconductor device according to claim 1, further comprising at least a second doped island formed in the first well region, and the second doped island contacts the first well region.

6. The semiconductor device according to claim 5, wherein the second doped island comprises the second conductivity type, and a concentration of the first doped islands is equal to a concentration of the second doped island.

7. The semiconductor device according to claim 5, wherein a depth of the first doped islands is equal to a depth of the second doped island.

8. The semiconductor device according to claim 1, further comprising a deep well region formed in the substrate, the deep well region comprising the first conductivity type.

9. The semiconductor device according to claim 8, further comprising a second well region comprising the first conductivity type, and the drain region is formed in the second well region.

10. The semiconductor device according to claim 9, wherein the first well region and the second well region are formed in the deep well region.

11. A semiconductor device comprising:
    a substrate;
    a gate positioned on the substrate;
    a drain region and a source region formed in the substrate at two respectively sides of the gate, the drain region and the source region comprising a first conductivity type;
    a first well region comprising a second conductivity type formed in the substrate, and the source region being formed in the first well region; and
    a plurality of first doped islands having the second conductivity type formed in the source region, a depth of the first doped islands being smaller than a depth of the source region, and the first doped islands being entirely spaced apart from the first well region by the source region.

12. The semiconductor device according to claim 11, further comprising at least a second doped island formed in the first well region, and the second doped island contacts the first well region.

13. The semiconductor device according to claim 12, wherein the second doped island comprises the second conductivity type, and a concentration of the first doped islands is equal to a concentration of the second doped island.

14. The semiconductor device according to claim 12, wherein a depth of the first doped islands is smaller than a depth of the second doped island.

* * * * *